United States Patent [19]

Levinos

[11] 3,856,528

[45] Dec. 24, 1974

[54] COLOR TONED PHOTOPOLYMERIZATION IMAGING PROCESS

[75] Inventor: Steven Levinos, Chatham, N.J.

[73] Assignee: Keuffel & Esser Company, Morristown, N.J.

[22] Filed: Aug. 10, 1972

[21] Appl. No.: 279,580

[52] U.S. Cl. .......................... 96/49, 96/28, 96/35.1, 96/91 R, 96/92, 96/115 P

[51] Int. Cl. .......................... G03c 5/34, G03f 7/08

[58] Field of Search ............. 96/49, 115 P, 35.1, 92

[56] References Cited

UNITED STATES PATENTS

| | | | |
|---|---|---|---|
| 1,712,428 | 5/1929 | Fritsche | 96/49 |
| 2,444,567 | 7/1948 | Husek | 96/49 |
| 2,935,403 | 5/1960 | Dickerson | 96/49 |
| 3,061,431 | 10/1962 | Levinos | 96/115 P |
| 3,203,805 | 8/1965 | Burg | 96/115 P |
| 3,248,220 | 4/1966 | Van Rhijh | 96/91 R |
| 3,409,438 | 11/1968 | Lokken | 96/49 X |
| 3,418,118 | 12/1968 | Thommes et al. | 96/35.1 |
| 3,479,183 | 11/1969 | Habib et al. | 96/91 R |
| 3,615,473 | 10/1971 | Andreas | 96/49 |
| 3,637,375 | 1/1972 | Levinos | 96/91 R |

OTHER PUBLICATIONS

Kosar; J., "Light-Sensitive Systems," Wiley & Sons, 1965, p. 27-37.

*Primary Examiner*—Charles L. Bowers, Jr.
*Attorney, Agent, or Firm*—Lionel N. White, Esq.

[57] ABSTRACT

Material useful in a photopolymerization imaging process which provides for post-development color-toning, comprises an ethylenically unsaturated polymerizable compound, a polymerization photo initiator consisting of a combination of a light-sensitive diazosulfonate and a photoreducible dye, and an azo coupler compound. An azo dye printout image formed during imagewise exposure of the material is supplemented by a color body formed upon the application of a toning composition including components of a color-forming redox reaction.

4 Claims, No Drawings

COLOR TONED PHOTOPOLYMERIZATION IMAGING PROCESS

BACKGROUND

Ethylenically unsaturated photopolymerizable compounds and compositions including such compounds have been widely used in photocopying and photoimaging processes which provide polymeric image formation in accordance with incident light exposure. As a result of imagewise exposure of supported compositions including photopolymerizable compounds, polymeric material is formed in the composition layer and generally provides a distinct variation between the comparative properties of polymerized and unpolymerized composition. In general, this difference in property, for example, an increase in resistance to dissolution upon photopolymerizing light exposure, may be employed to separate the less exposed and thus unpolymerized areas of the composition from those areas defining the imagewise exposure.

Although polymeric images formed in the foregoing manner are relatively permanent and resist abrasion and handling, the polymeric material of which the image is formed is for the most part translucent or only lightly colored and therefore fails to provide an image of suitable contrast.

Polymeric photoimages have heretofore been prepared from compositions with incorporated dyes or pigments in order to impart to the polymeric image remaining after development sufficient density to be useful in direct reading or projection transparency prints. such initial incorporation of coloring material within the photopolymerizable composition was generally disadvantageous, however, in view of the fact that such coloring matter reduced, at the outset, the actinic transparency of the photopolymerizable material and thus reduced the effective light sensitivity of the imaging composition.

Alternate methods of applying surface coloring compositions after development of the photopolymeric images was likewise not entirely successful in view of the fact that such coloring compositions of sufficient density to provide effective imaging were indiscriminate in imparting color tone to such images and failed to provide a means for distinguishing image areas resulting from lesser light exposure; i.e., were incapable of yielding satisfactory continuous-tone images.

SUMMARY

The present invention provides means for obtaining an initial colored print-out image which is indicative of the pattern of exposure and polymerization and which is useful in obtaining proper register of multiple or overlay image formation, and additionally provides means for color-toning polymeric images subsequent to dissolution or wash-off development.

The photopolymerizable composition employed in the preparation of photoimaging material according to the present invention includes the use of the combination of a polymerizable monomer and a polymerization initiator comprising a diazosulfonate compound and a photoreducible dye as described in U.S. Pat. No. 3,637,375. In addition to the polymerization initiator and ethylenically unsaturated polymerizable materials there described, compositions of the present invention include an azo dye coupler of the type commonly employed in the diazotype art.

Imagewise light exposure of the combination of diazosulfonate-containing polymerization initiator and azo dye coupler yields a printout image through the combination of the coupler compound with diazonium cation resulting from the photolytic dissociation of the diazosulfonate.

The present invention additionally provides a means for intensifying the polymeric image or varying the color tone thereof subsequent to wash-off development after light exposure and includes the application of a composition which comprises a reducible component of a potential color-forming reaction. The reducible component is reduced by the azo dye coupler present in the polymeric image and, depending upon the rate of printout image formation and thus the consumption of the azo coupler compound, the reduction of this component occurs in generally inverse proportion to the density of the printout image. The toning composition further includes a co-reactant component which is capable of forming a color body with the reduced form of the reducible component. Thus application of the toning composition generates a color body in the polymeric image in such proportions as will supplement the azo dye printout image generated at the time of light exposure.

DESCRIPTION

Photopolymerizable imaging materials utilizing a light-sensitive diazosulfonate compound in combination with a photoreducible dye as the photoinitiator composition have been described in great detail in U.S. Pat. No. 3,637,375. The extensive descriptions to be found there are useful in the preparation of the instant polymeric images and that disclosure forms a basis for the present invention.

Any of the various photoreducible dyes and diazosulfonate compounds previously utilized in the formation of photoinitiator compositions may be employed in the present invention. Likewise, the broad range of ethylenically unsaturated polymerizable materials, such as the vinyl monomers as well as the many known difunctional monomeric cross-linking agents, may be employed in the formation of the polymeric images in the present invention.

The instant procedures represent an improvement in the previously described photopolymerization imaging process and relate in particular to methods and materials useful in providing an intensification in color of the resulting polymeric image and an improvement in the tonal balance and quality of the coloration of such images.

In accordance with the present invention, the coated layer of polymerizable composition comprising the monomeric component, the light-sensitive diazosulfonate and the photoreducible dye further includes an azo dye coupler which is capable of coupling with a diazonium compound to provide a dye color body of distinctive contrast to the unexposed polymerizable composition.

Upon exposure of the resulting imaging material, there occurs in the light struck areas the polymerization reaction described in U.S. Pat. No. 3,637,375. Concurrently there occurs formation of the corresponding diazonium cation as a result of the photolytic dissociation of the diazosulfonate compound. This moeity is thus made available to couple with the azo dye coupler component to form a distinct color body as generally described in U.S. Pat. No. 3,525,978.

While in this latter reference conditions of elevated alkalinity are maintained in order to provide an optimum dye density, the substantially neutral pH conditions in the present compositions are sufficient to yield an immediately discernible image upon light exposure of the composition. Such a printout image is particularly useful in establishing registry for multiple image exposures as well as to obtain a guide to the extent of photopolymerization achieved.

The degree of color tone derived upon light exposure in the printout image being dependent in great part upon the amount of generated diazonium compound available for the azo dye coupling reaction, it will become apparent that under circumstances where the rate of dissociation of the diazonium compound, itself being a light-sensitive material, is only slightly less than the rate of the dye coupling reaction, very little tonal quality will be achieved in the azo dye printout image. When, for example, the polymerizable composition is exposed to light of high photolytic activity, a substantial amount of the derived diazonium compound may be destroyed before it can enter into the dye coupling reaction. Under such circumstances, however, there will remain in the polymeric image a comparative excess of the azo dye coupler component, this comound not having been consumed in the azo dye formation. Such a light exposure dependency of the amount of azo coupler compound residual in the polymeric image provides a basis for the toning procedure of the present invention.

The common azo dye coupler compounds useful in the present invention include most of those common couplers utilized in the diazotype art and generally comprise phenolic compounds which exhibit the character of at least mild reducing agents. Thus in accordance with the amount and degree of initial light exposure received by the polymerizable layer, the resulting polymeric image will contain more or less of the azo coupler reducing agent.

According to the present invention, the polymeric image retained upon the support subsequent to wash-off development is contacted with a composition, preferable in fluid state for ease of handling, comprising a first reducible component and a second component which is readily capable of forming a distinct color body with the reduced form of the first component of the toning fluid. Such a toning fluid composition may, for example, comprise an alkali metal ferricyanide, the anion of which is reduced upon contact with the azo dye coupler to the ferrocyanide, and a ferric salt second component, the cation of which forms the distinct insoluble Prussian Blue color body with the ferrocyanide. Thus, to the extent that the polymeric image is initially deprived of diazonium compound and its related azo dye color body, the image, upon contact with the toning composition, is provided with additional color body by virture of the redox color-forming reaction involving the residual azo coupler component.

By means of the present invention, therefore, polymeric images may be formed and then significantly colored subsequent to light exposure of the polymerizable composition. The imaging process, therefore, does not suffer from the disadvantage of light attenuation associated with pre-pigmented polymerizable compositions.

The capability provided by the present invention of supplementing the visual density of polymeric images is particularly advantageous in the formation of continuous-tone images. Exposure of the present imaging material through a continuous-tone negative, for example, results in the incidence of unattenuated, high intensity light in areas of negative highlight with resulting rapid dissociation of the diazosulfonate, polymer formation, and photolytic destruction of the diazonium compound, the latter generally occurring at a greater rate than that at which azo dye forming coupling can take place. The polymeric image in such areas is thus disproportionately low in azo dye color density. On the other hand, exposing light attenuated to a greater extent by the shadow areas of the negative results in less polymer formation, yet due to the lower intensity of such incident light the rate of diazonium degradation is significantly less than the coupling rate and the polymeric image acquires a greater degree of dye color density. Post-development application of the toning composition, however, utilizes the greater unused coupler density in the areas of the imaging composition corresponding to the negative highlights to form a like greater density of color body and fortify the positive image in such areas, thereby achieving a more correct tonal scale over the whole image.

Additionally, it has become possible to not only provide excellent continuous-tone images, but also through various combinations of components in the color-forming composition of the toning bath to render the tonal quality of the resulting image, as desired, in a broad range of warm or neutral color tones. The general availability of numerous components for the color-forming redox reaction provides a ready means for varying the color as well as the tonal quality of the resulting polymeric image. For example, the use of a uranyl salt in place of the ferric salt, with a resulting formation of insoluble warm toned uranyl ferrocyanide, or the use of a combination of these 2 second component compounds, can provide a wide range of tones in the resulting polymeric image when combined in a toning fluid composition with the noted alkali metal ferricyanide salt.

An additional advantage has been observed in material of the present invention in that there is apparently achieved a general imagewise toughening of the polymeric image through the hardening of colloidal binder material, such as gelatin, which is often included in the polymerizable composition. The hardening of the colloid component may likely be the result of its contact with the oxidationproduct of the reducing azo coupler, for example, the quinone derived from a phloroglucinol coupler.

The utility of the present invention will be further evident in the following examples.

PREFERRED EMBODIMENTS

EXAMPLE 1

A mixture of the following composition was prepared with constant stirring under normal yellow safelight conditions:

| | |
|---|---|
| Deionized water | 340 ml. |
| Gelatin (high bloom, inert) | 18.0 g. |
| Polyvinyl pyrrolidone (med. visc.) | 2.0 g. |
| Sodium dodecyl sulfate (20% aq. sol.) | 12 ml. |
| Denatured ethanol | 140 ml. |

-Continued

| | |
|---|---|
| Phloroglucinol | 3.2 g. |
| Acetoacetanilide | 0.4 g. |
| Sodium salt of p-diazosulfonate-1-tolyl mercapto-2,5-dimethoxybenzene | 4.0 g. |
| Acrylamide | 7.2 g. |
| N,N'-methylenebisacrylamide | 1.6 g. |
| Trimethylolpropane (50% aq. sol) | 8.0 g. |
| Glycerin | 10.0 g. |
| Methylene blue (0.5% aq. sol.) | 1 ml. |
| Rose bengal (0.5% aq. sol.) | 1 ml. |
| Sodium fluorescein (0.5% aq. sol.) | 1 ml. |
| Thymol (1% EtOH sol.) | 4 ml. |

The resulting mixture, exhibiting a pH of about 6.8, was coated on a clear, subbed polyethylene terphthalate film base of about 0.1 mm thickness on a vertical loop meniscus coater at a speed of about 3m/min. and dried at yellow safelight room conditions to provide photosensitive imaging sheet material.

In a manner common to photopolymerization imaging procedures, particularly when preparing continuous-tone prints, a sheet of the imaging material was exposed for about 2 minutes through a continuous-tone negative placed in contact with the uncoated side of the film base in a commercial xenon arc vacuum frame photoprinting device. The practice of exposing through the base ensures that the formation of polymeric image begins at the coated film surface and thus that the image is firmly adhered to the support irrespective of the extent of exposure. Line and half-tone prints, on the other hand, may normally be exposed from either side in view of the usually excess light exposure and complete polymerization through the whole composition layer.

Subsequent to exposure the sheet yielded a dark brown/yellow positive image. A spray wash for about one minute with water of about 35°C removed unpolymerized composition and a brown, discernibly continuous-tone image remained on the film.

The imaged sheet was then immersed for about 15 seconds in a solution of:

| | |
|---|---|
| Potassium ferricyanide (10% aq. sol.) | 10 ml. |
| Ferric nitrate · $9H_2O$ (12% aq. sol.) | 10 ml. |
| Uranyl acetate · $2H_2O$ (8% aq. sol.) | 7 ml. |
| Deionized water | 73 ml. |

Rinsed with water for a few seconds, the final print provided a substantially neutral continuous-tone positive transparency of excellent resolution.

EXAMPLE 2

Use of a 500 watt photoflood lamp at a distance of about 15 cm. in place of the xenon arc in the procedures of Example 1 provided a similar excellent neutral-toned image.

EXAMPLE 3

The material of Example 1 was exposed in the xenon arc printer through a high contrast resolution test negative and provided a good neutral tone line image with a resolution of about 60 line pr./mm. A coating of the same polymerizable composition on a support of about 0.06 mm thickness provided a similar image with a resolution of about 80 line pr./mm.

EXAMPLE 4

The following composition was prepared and used to make imaging material according to the procedures of Example 1:

| | |
|---|---|
| Deionized water | 230 ml. |
| Gelatin (high bloom, inert) | 12.0 g. |
| Polyvinyl pyrrolidone (med. visc.) | 1.3 g. |
| Sodium dodecyl sulfate (20% aq. sol.) | 8 ml. |
| Denatured ethanol | 95 ml. |
| Phloroglucinol | 2.1 g. |
| Pyrogallol | 0.6 g. |
| Sodium salt of p-diazosulfonate-1-tolyl mercapto-2,5-dimethoxybenzene | 2.7 g. |
| Acrylamide | 4.8 g. |
| N,N'-methylenebisacrylamide | 1.1 g. |
| Trimethylolpropane (50% aq. sol.) | 6.1 g. |
| Glycerin | 8.0 g. |
| Methylene blue (0.5% aq. sol.) | 1 ml. |
| Rose bengal (0.5% aq. sol.) | 1 ml. |
| Sodium fluorescein (0.5% aq. sol.) | 1 ml. |
| Thymol (1% EtOH sol.) | 3 ml. |

Exposure for one minute in the xenon arc printer and water development provided a red-brown image of notable continuous tone. An excellent continuous neutral tone image was then obtained with a toning solution of:

| | |
|---|---|
| Potassium ferricyanide (10% aq. sol.) | 10 ml. |
| Ferric nitrate . $9H_2O$ (12% aq. sol.) | 10 ml. |
| Uranyl acetate . $2H_2O$ (8% aq. sol.) | 5 ml. |
| Deionized water | 75 ml. |

To provide an indication of the numerous colors available in the polymeric image prior to toning, the following combinations of diazosulfonate and azo coupler were included in polymerizable layers otherwise comparable to that of Example 1. In general, the relative amounts of these two components in the compositions were based on the stoichiometric dye-forming ratio of the coupler with the respective derivative diazonium compound. Such ratio is by no means essential, however, since it merely ensures the presence of an effective amount of coupler under any of the variety of exposure conditions which might be encountered in the ultimate use of the material.

EXAMPLE 5

The diazosulfonate of p-diazo-1-tolymercapto-2,5-dimethoxy benzene was combined with each of the following couplers in the imaging formulation of Example 1 which then provided printout polymeric images of the noted color:

| | |
|---|---|
| Acetoacetanilide | yellow |
| Pyrogallic acid | red |
| 2-methyl-3-ethyl thiozolium tolyl sulfonate | orange |

Toning solutions of the type used in Example 1 and varying in ferric: uranyl salt ratio, depending on the desired final image tone, were applied to the various wash-off developed images to obtain an additional range of image coloration.

EXAMPLE 6

With the diazosulfonate of p-diazo-1-benzoylamino-2,5-diethoxy benzene, the following couplers provided tonable images of the indicated printout color:

| | |
|---|---|
| Acetoacetanilide | brown |
| Diresorcinol | red-brown |
| 2-methyl-5,6-dimethoxy-3-ethyl-benzothiazolium ethyl sulfate | orange |

EXAMPLE 7

With the diazosulfonate of p-diazo-1-benzoylamino-2,5-diethoxy benzene, the following couplers provided tonable images of the indicated printout color:

| | |
|---|---|
| Acetoacetanilide | orange |
| Sodium-2,3-dihydroxynaphthalene-6-sulfonate | green |

What is claimed is:

1. In an imaging process which comprises exposing to light through a continuous tone image carrying material a supported layer of photopolymerizable composition comprising an ethylenically unsaturated polymerizable compound, a light-sensitive aromatic diazosulfonate, and a photoreducible dye a time sufficient to effect polymerization in the light-exposed areas of said composition, and separating unpolymerized composition from said layer to thereby form a polymeric image defining such imagewise light exposure, the improvement comprising:

a. including an azo coupler compound in said photopolymerizable composition layer; and b. subsequent to said image-forming step, contacting the resulting polymeric image with a toning composition including a first compound comprising a ferricyanide ion reducible in the presence of said azo coupler compound, and a second compound comprising an ion selected from ferric and uranyl ions capable of forming a distinct color body with the reduced form of said first compound ion.

2. The improvement according to claim 1 wherein said first compound is a substantially water soluble ferricyanide salt.

3. The improvement according to claim 2 wherein said second compound is selected from a group consisting substantially of water soluble ferric and uranyl salts.

4. The improvement according to claim 1 wherein said toning composition comprises an aqueous solution of an alkali metal ferricyanide, ferric salt, and a uranyl salt.

* * * * *